(12) United States Patent
Baty

(10) Patent No.: US 10,503,593 B2
(45) Date of Patent: *Dec. 10, 2019

(54) TWO LAYER QUAD BIT ERROR CORRECTION

(71) Applicant: Everspin Techonolgies, Inc., Chandler, AZ (US)

(72) Inventor: Kurt Baty, Austin, TX (US)

(73) Assignee: Everspin Technologies, Inc., Chandler, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/125,117

(22) Filed: Sep. 7, 2018

(65) Prior Publication Data

US 2019/0004898 A1 Jan. 3, 2019

Related U.S. Application Data

(63) Continuation of application No. 14/923,565, filed on Oct. 27, 2015, now Pat. No. 10,102,064.

(51) Int. Cl.
*G06F 11/10* (2006.01)
*H03M 13/13* (2006.01)
*H03M 13/15* (2006.01)
*H03M 13/29* (2006.01)
*H03M 13/19* (2006.01)

(52) U.S. Cl.
CPC ..... *G06F 11/1076* (2013.01); *H03M 13/2906* (2013.01); *H03M 13/1505* (2013.01); *H03M 13/19* (2013.01)

(58) Field of Classification Search
CPC ... G06F 11/1076; H03M 13/13; H03M 13/19; H03M 13/00; H03M 13/1505; H04L 69/324; H04L 1/0042; H04L 1/0057; H04N 21/2383; H04N 21/4382; H04J 13/0014; H04J 13/1505

See application file for complete search history.

(56) References Cited

U.S. PATENT DOCUMENTS

| 4,414,667 | A | * | 11/1983 | Bennett | H03M 13/15 714/783 |
|---|---|---|---|---|---|
| 4,597,090 | A | * | 6/1986 | Forney, Jr. | H03M 13/251 375/261 |
| 5,517,510 | A | | 5/1996 | Kuban et al. | |
| 7,546,510 | B2 | | 6/2009 | Dror et al. | |
| 7,860,128 | B2 | | 12/2010 | Niu et al. | |
| 8,102,853 | B2 | | 1/2012 | Ngo et al. | |
| 8,136,021 | B2 | * | 3/2012 | Roh | H03M 13/03 714/781 |
| 8,306,060 | B2 | | 11/2012 | Ngo et al. | |
| 8,332,732 | B2 | * | 12/2012 | Lakkis | H04J 13/0014 714/758 |
| 8,472,497 | B2 | * | 6/2013 | Lakkis | H04J 13/0014 375/130 |

(Continued)

*Primary Examiner* — Phung M Chung
(74) *Attorney, Agent, or Firm* — Bookoff McAndrews, PLLC

(57) ABSTRACT

In some examples, a memory device may be configured to provide quad bit error correction circuits. For example, the memory device may be equipped with a two layer error correction circuit. In some cases, the first layer may utilized one or more Hamming coders and the second layer may utilize one or Golay coders. In some examples, the Golay coders may be grouped into sets of Golay coders.

20 Claims, 11 Drawing Sheets

(56) References Cited

U.S. PATENT DOCUMENTS

| | | |
|---|---|---|
| 8,549,365 B2 | 10/2013 | Carlach |
| 8,804,790 B2 * | 8/2014 | Lakkis ................. H04B 1/7093 |
| | | 375/130 |
| 8,856,828 B2 * | 10/2014 | Lee ........................ H04H 60/72 |
| | | 725/39 |
| 9,094,108 B2 * | 7/2015 | Lakkis ................... H04B 1/707 |
| 10,102,064 B1 | 10/2018 | Baty |
| 2002/0013919 A1 | 1/2002 | Kleihorst et al. |
| 2003/0191999 A1 * | 10/2003 | Kleihorst .............. G06F 11/085 |
| | | 714/735 |
| 2011/0289367 A1 | 11/2011 | Carlach |

* cited by examiner

TWO LAYER QUAD BIT ERROR CORRECTION

CROSS-REFERENCE TO RELATED APPLICATION(S)

This patent application is a continuation application of and claims the benefit of priority to U.S. patent application Ser. No. 14/923,565, filed on Oct. 27, 2015, (now U.S. Pat. No. 10,102,064), the entirety of which is incorporated herein by reference.

BACKGROUND

In general, memory devices are typically designed with no more than two bit error correction. However, during manufacturing some number of memory devices typically experience a higher failure rate than may be correctable with two bit error correction or even three bit error correction. These memory devices are typically discarded and result in lower device yields. Therefore, increasing the number of bits that may be corrected while ensuring accurate functionality of the memory devices may result in increased yields when manufacturing memory devices.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

DETAILED DESCRIPTION

Figure 1:
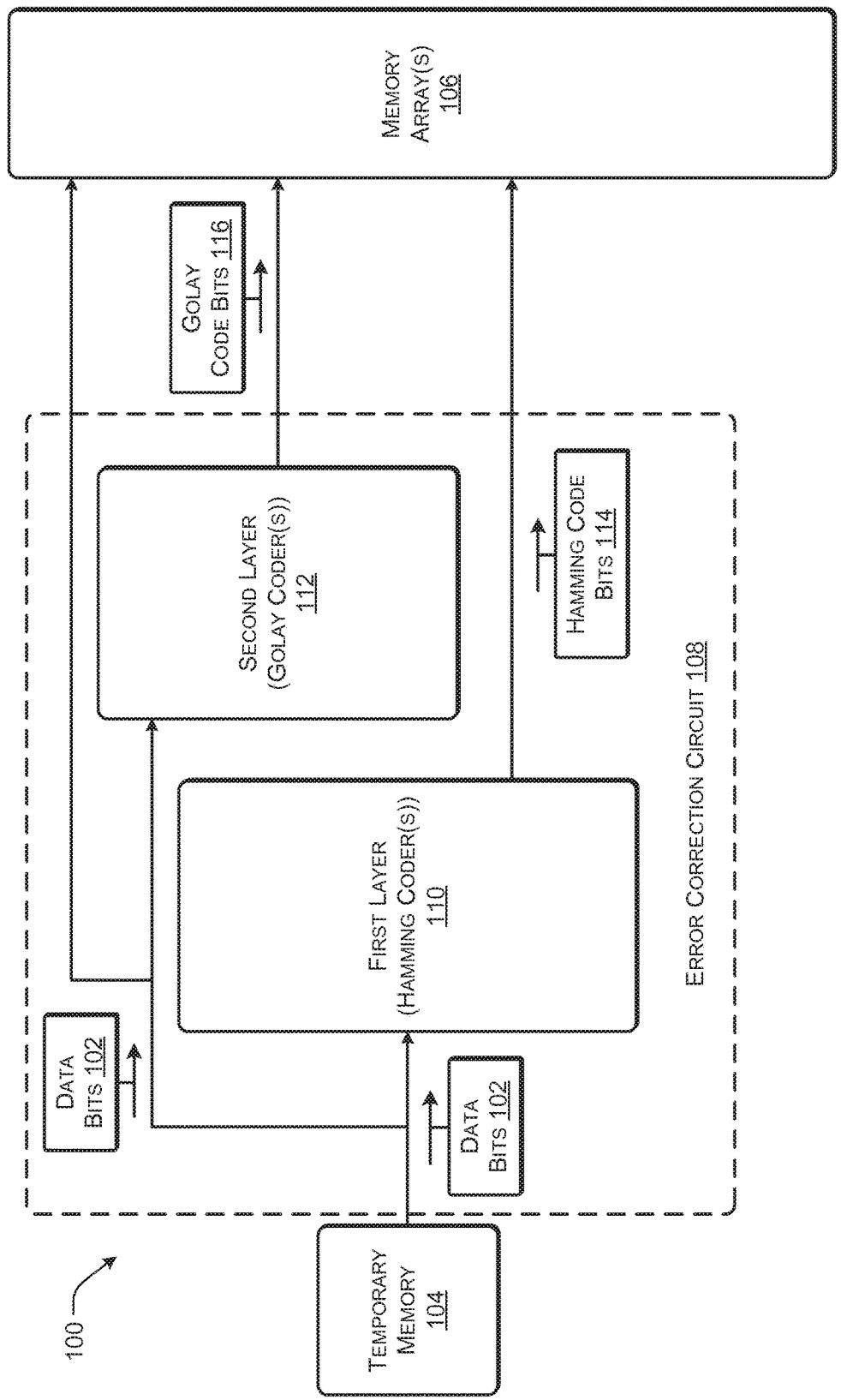
FIG. 1 illustrates a block diagram showing select components of an example two layer quad bit error correction circuit according to some implementations.

This disclosure includes techniques and implementations to improve the reliability and yields associated with manufacturing and operating memory devices. For each batch of memory devices manufactured, some portion of the memory devices include some number of bits that fail to operate correctly and, thereby, may introduce errors into data stored on the memory devices. Fortunately, the number of bits that fail are typically sparsely located throughout the memory device and include only a small percentage of the overall storage space. Thus, most memory devices are equipped with single bit error correction or double bit error correction which is capable of maintaining data integrity on the memory devices despite the fails bits.

However, on some portion of memory devices, single or even double bit error correction may be insufficient to maintain data integrity. Typically, these devices are classified as junk and discarded resulting in a complete loss for the manufacturer of the cost associated with assembling the discarded memory devices. Thus, described herein are example implementations for configuring and/or equipping memory devices to include up to quad bit error correction. Additionally, some implementations described herein maintain the memory devices ability to utilize industry standard dual in-line memory module (DIMM) and/or small outline dual in-line memory module (SODIMM) interfaces. In this manner, some number of the memory devices that would otherwise be discarded may be classified as functional (e.g., capable of maintain data stored on the device at a reliable level) and sold by the manufacturer.

In one example, a memory device may be configured to generate error correction codes prior to storing the data in the memory arrays. In some cases, the data is first processed by a Hamming coder (or encoder) to generate a Hamming code that includes the data plus Hamming code bits. The data may then be processed by one or more Golay coders (or encoders) to generate one or more Golay codes that includes the data plus the Golay code bits. The data bits are then stored with the Hamming code bits and the Golay code bits.

When the data is next accessed by an external source from the memory device, the data, the Hamming code bits, and the Golay code bits are read from the memory arrays. The Golay coders (or decoders) process the data bits and the Golay code bits read from the memory arrays to generate a Golay correction bit vector representative of errors within the data and/or Golay code bits. For example, the Golay coders may generate a second set of Golay code bits from the data read from the memory arrays and compare the second set of Golay code bits with the first set of Golay code bits read from the memory arrays to generate the Golay correction bit vector. .Once the Golay correction bit vector is generated, either the Golay coders or another circuit of the memory device (such as a correction circuit) may correct the data bits based on the Golay correction bit vector.

After the data bits are corrected based at least in part on the Golay correction bit vector, the Hamming coder (or decoder) processes the, data bits and the Hamming code bits read from the memory arrays to generate a Hamming correction bit vector representative of errors within the data and/or Hamming code bits. For example, the Hamming coder may generate a second set of Hamming code bits from the data read from the memory arrays and compare the second set of Hamming code bits with the first set of Hamming code bits read from the memory arrays to generate the Hamming correction bit vector. Once the Hamming correction bit vector is generated, either the Hamming coder or another circuit of the memory device (such as the correction circuit) may correct the data bits based on the Hamming syndrome. Once the data bits are corrected by the Hamming correction bit vector, the data bits may be stored at or provided to a location accessible by the external source.

Thus, in some cases, the error correction circuits may be organized into a two layer error correction (e.g., the Hamming layer and the Golay layer). In this manner, the memory device may achieve quad bit error correction, as errors that would typically be missed using Golay correction may be corrected by Hamming correction and vice versa.

In one particular example, a memory device maybe configured to store data in blocks of 64 bits. In some cases, the memory device may be configured to include eight Hamming (78, 64) coders. Each of the eight Hamming coders may receive a copy of the 64 bits of data to be stored in the memory array and each generate individual 14 bit Hamming codes. Thus, after processing by the Hamming coders, eight different 78 bit Hamming codes (e.g., the 64 data bits plus the 14 Hamming code bits) are generated.

In this particular example, the memory device may also include 16 sets of Golay coders. Each set of Golay coders may include two Golay (22, 11) coders and one Golay (21, 10) coder. In this example, each of the eight copies of the 64 data bits may be segmented into two 32 bit groups: Each of the 16 32 bit groups are then provided to one of the 16 sets of Golay coders. Thus, the 32 bits of data may be divided such that 11 bits of data are processed by the first Golay (22, 11) coder of the set, the second 11 bits of data are processed by the second Golay (22, 11) coder, and the remaining 10 bits of data are processed by the Golay (21, 10) coder. For each set of Golay coders, the first and second Golay (22, 11) coders each generate a 22 bit Golay code (e.g., the 11 data bits plus the 11 Golay code bits) and the Golay (21, 10) coder generates a 21 bit Golay code (e.g., the 10 data bits plus the 11 Golay code bits). Thus, for each set of Golay coders 32 data bits and 33 Golay code bits are produced.

In the current example, each set of 14 Hamming code bits are segmented into two groups of 7 Hamming code bits. Each of the 16 7 bit Hamming code bit groups are associated with 32 data bits and the corresponding Golay code bits to form 16 72 bit blocks, which may accessed be as a single fetch. In some cases, the memory device may include 8 arrays or bytes. Each array or byte may then store two 72 bit blocks of data (in addition to data associated with other fetches). In this manner, each Hamming coder may use no more than 2 bits of associated with each of the 6 Golay coders (e.g., 3 Golay coders for the first 72 bits and 3 Golay coders from the second 72 bits). Similarly, the particular data bits provided to each of the Golay coders of the set may be selected such that no memory array or byte stores more than 3 bits from a particular Golay coder and each bit column of the memory arrays stores no more than 3 bits from a particular Golay coder.

In this current example, a memory device may be equipped with quad bit error correction using a two layer (e.g., a Hamming layer and a Golay layer) error correction. For instance, in the particular example, the memory device may utilize 1152 bits to store 64-bits of data. However, the memory device may reliably operate using the standard DIMM interface and, thus, may be sold as a lower density device providing some return on investment to the manufacturer.

FIG. 1 illustrates a block diagram showing select components of an example two layer quad bit error correction circuit according to some implementations. In the current example, a memory device 100 is illustrated as writing data bits 102 stored in a temporary memory 104 into one or more memory arrays 106. In this example, the data bits 102 are encoded by error correction circuit 108 prior to storage in the memory arrays 106. The memory device 100 and/or the memory arrays 106 may be a tangible non-transitory computer storage media and may include volatile and nonvolatile memory and/or removable and non-removable media for storage of information such as computer-readable instructions or modules, data structures, program modules or other data. Such computer-readable media may include, but is not limited to, RAM, ROM, EEPROM, flash memory or other computer-readable media technology, solid state storage, magnetic disk storage, RAID storage systems, storage arrays, network attached storage, storage area networks, cloud storage, or any other medium that can be used to store information and which can be accessed by an external source or internal circuit, such as a processor.

In the current example, the error correction circuit 108 is partitioned into two layers 110 and 112. The first layer 110 includes one or more Hamming coders (or Hamming encoders) and the second layer 112 includes one or more Golay coders (or Golay encoders). In this manner, the memory device may achieve quad bit error correction, as errors that would typically be missed using a Golay error correction code circuit when the data bits 102 are read from the memory arrays 106 may be corrected by the Hamming error correction code circuit and vice versa.

In one example, the memory device 100 may be configured to generate error correction codes prior to storing the data bits 102 in the memory arrays 106. In the current example, the data bits 102 are first processed by one or more Hamming coder of the first layer 110 to generate a Hamming code that includes the data bits 102 plus Hamming code bits 14. The data bits 102 may also be passed through the Hamming coders 110 or the first error correction layer to the Golay coders of the second layer 112, while the Hamming code bits 114 may be stored in the memory arrays 106.

The data bits 102 may then be processed by the Golay coders of the second layer 112 to generate one or more Golay codes that includes the data bits 102 plus the Golay code bits 116. The data bits 102 and the Golay code bits 116 are stored with the Hamming code bits 114 in the memory arrays 106. In some eases, the data bits 102, the Hamming code bits 114, and the Golay code bits 116 may be stored as multiple copies, with each copy being stored in a different memory array 106 to further improve the overall accuracy of the data being accessed from the memory device 100 by the external source.

While the current example illustrates the memory device 100 storing the data bits 102 in the memory arrays 106, the memory device 100 also reads the data bits 102 from the memory arrays 106 when the data bits 102 are accessed by an external source. When the data bits 102 are read from the memory arrays 106, the Hamming code bits 114 and the Golay code bits 116 are also, read from the memory arrays 106 and the data bits 102, the Hamming code bits 114, and the Golay code bits 116 are processed by the error correcting circuit 108 prior to storing in the temporary memory 104.

When the data bits 102 are read, the error correction circuit 108 first performs the operations associated with the second layer or the Golay coders of the second layer 112 to the data bits 102 and the Golay-code bits 116 to generate a Golay correction bit vector. The Golay correction bit vector is a representation of errors within the data bit 102 and/or Golay code bits 116, which may be corrected by the error correction circuit 108; For example, the Golay coders 112 (or Golay decoders) may generate a second set of Golay code bits (not shown) from the data bits 102 read from the memory arrays 106 and compare the second set of Golay code bits with the first set of Golay code bits 116 read from the memory arrays 106 to generate the Golay correction bit vector. Once the Golay correction bit vector is generated, the Golay coders 116 may cause or signal another component (not shown) of the error correction circuit 108 (such as a correction circuit) to correct the data bits 102 and the Golay code bits 116 based on the Golay correction bit vector. For example, the correction circuit may flip the value of data bits with detected errors.

After the second layer correction 112 is applied, the error correction circuit 108 performs the operations associated with the first layer 110 or the Hamming coders to the data bits 102 and the Hamming code bits 114 to generate a Hamming correction bit vector. The Hamming correction bit vector is a representation of errors within the data bit 102 and/or Hamming code bits 114, which may be corrected by the error correction circuit 108. For example, the Hamming coders (or Hamming decoders) of the first layer 110 may generate a second set of Hamming code bits (not shown) from the data bits 102 read from the memory arrays 106 and compare the second set of Hamming code bits with the first set of Hamming code bits 114 read from the memory arrays 106 to generate the Hamming correction bit vector. Once the Hamming correction bit vector is generated, either the Hamming coders 114 or another component (not shown) of the error correction circuit 108 (such as a correction circuit) may correct the data bits 102 and the Hamming code bits 114 based on the Hamming correction bit vector. Once the data bits 102 are corrected based on the Hamming correction bit vector, the data bits 102 may be stored in the temporary memory 104 for access by the external source.

Figure 2:
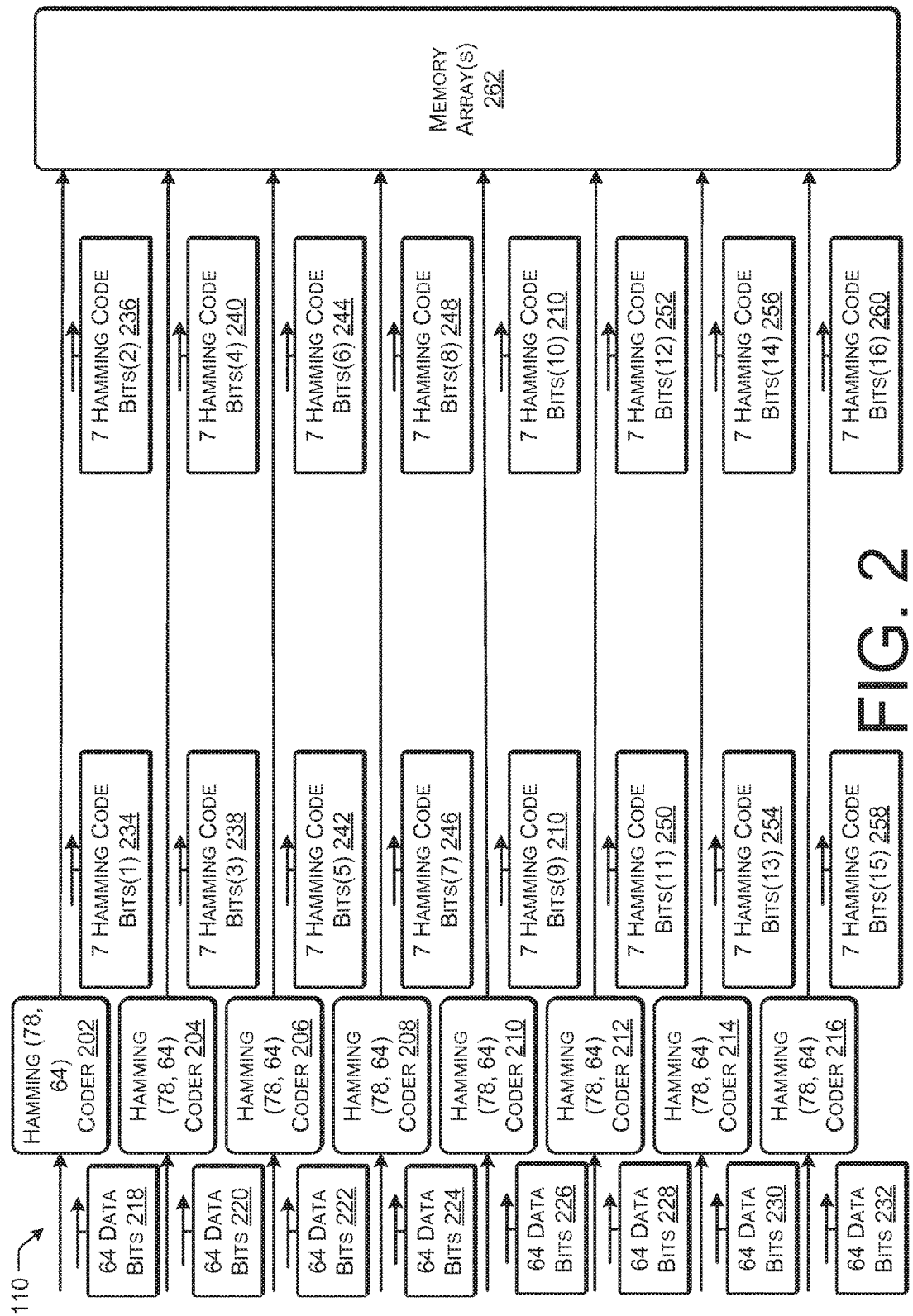
FIG. 2 illustrates a block diagram showing select components of a first layer of the quad bit error correction circuit of FIG. 1.

FIG. 2 illustrates a block diagram showing select components of a first layer 110 of the quad bit error correction circuit of FIG. 1. For instance, the illustrated example shows one possible implementation of Hamming coders that may be utilized to implement the first layer 200 of the quad bit error correction discussed above with respect to FIG. 1. In this example, the first layer 110 or the Hamming code layer includes eight Hamming (78, 64) coders 202-216. Each of the Hamming (78, 64) coders 202-216 are configured to receive 64 bits of data and to generate a 14 bit long Hamming code, which may be utilized to correct an error within either the 64 bits of data or the 14 Hamming code bits.

In the illustrated example, 64 data bits are being processed as part of a write command received by a memory device incorporating the two layer quad bit error correction circuit as described above with respect to FIG. 1. In the current example, eight copies of the 64 data bits 202-232 are generated by the memory device. Each of the copies of the 64 data bits 202-232 are provided to one of the eight Hamming (78, 64) coders 202-216 for processing.

Each of the eight Hamming (78, 64) coders 202-216 generate an individual 78 bit Hamming code. The 78 bit Hamming code including 64 bits associated with the corresponding copy of the data bits 202-232 and fourteen Hamming code bits. Each of the eight fourteen Hamming code bits are segmented in half to generate sixteen seven Hamming code bits 234-260. Each of the sixteen seven Hamming code bits 234-260 are stored with the 32 data bits (e.g., half of the 64 data bits) and 33 Golay code bits generated at a second layer of the quad bit error correction circuit described below with respect to FIG. 3.

Figure 3:
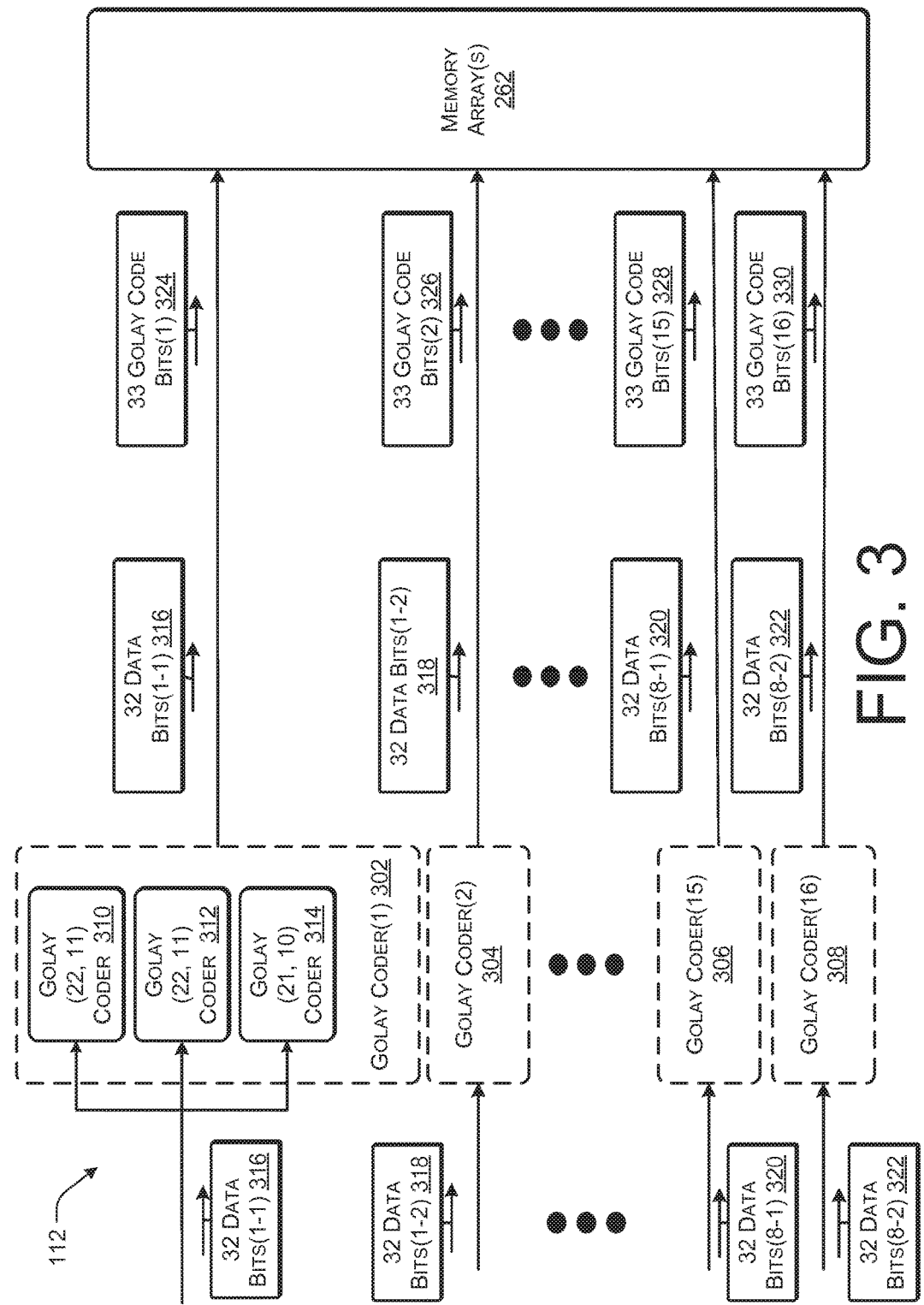
FIG. 3 illustrates a block diagram showing select components of a second layer of the quad bit error correction circuit of FIG. 1.

FIG. 3 illustrates a block diagram showing select components of a second layer 112 of the quad bit error correction circuit of FIG. 1. In the illustrated example, the 64 data bits coded by the Hamming (78, 64) coders 202-216 of FIG. 2 are being processed by the second layer 112 of the two layer quad bit error correction circuit as part of the write command received by a memory device prior to storing each copy of the 64 data bits in the memory array 262.

For instance, the illustrated example shows one possible implementation of Golay coders that may be utilized to implement the second layer 300 of the quad bit error correction discussed above, with respect to FIG. 1. In this example, the second layer 112 or the Golay code layer includes sixteen sets of Golay coders, generally indicated by Golay coders(1)-(16) 302-308. In this example, each set of the Golay coders 302-308 include three additional Golay coders. For instance, as illustrated with respect to the Golay Coder set(1) 302, each set of Golay coders(1)-(16) 302-308 may include a first Golay coder (22, 11) 310, a second Golay coder (22, 11) 312, and a Golay coder (21, 10) 314.

In the illustrate example, each set of Golay coders(1)-(16) are configured to receive 32 bits of data (e.g., half of the 64 data bits encoded by the Hamming code layer 200). For example, as discussed above with respect to FIG. 2, eight copies of the 64 data bits are coded by eight individual Hamming (78, 64) coders to generate sixteen sets of 7 Hamming code bit (e.g., eight sets of 14 Hamming code bits). In the current example, each of the eight copies of the 64 data bits are segmented in half to generate sixteen 32 data bit groups. In other words, the second layer 300 may receive eight copies of the first 32 data bits and eight copies of the second 32 data bits, generally indicated by 32 data bits(1-1)(1-2)-(8-1)(8-2) 316-322, that together form eight copies of the 64 data bits being written to the memory array 262.

For example, with respect to the first set of Golay coders 302, the 32 data bits(1-1) 316 may be received either from a temporary memory or via the second error correction layer circuit 200. In general, 11 bits of the 32 data bits(1-1) 316 are provided to the first Golay (22, 11) coder, another 11 bits of the 32 data bits(1-1) 316 are provided to the second Golay (22, 11) coder, and the final 10 bits of the 32 data bits(1-1) 316 are provided to the Golay (21, 10) coder. The first Golay (22, 11) coder, the second Golay (22, 11) coder, and the Golay (22, 10) coder generate 33 Golay code bits(1) 324 from the 32 data bits(1-1) 316. The 32 data bits(1-1) 316, the 33 Golay code bits(1) 324, and seven Hamming code bits (such as Hamming Code bits(1) 234 of FIG. 2) are then stored in the memory array 262 or in the same byte. Similar to the first set of Golay coders 302, each set of the Golay coders(1)-(16) 302-308 each encode 32 data bits as described above with respect to the first set of Golay coders 302 to generate 33 Golay code bits(2)-(16) 326-330. In some cases, such as the illustrated example, the 32 data bits(1-1) 316, the 33 Golay code bits(1) 324, and seven Hamming code bits (such as Hamming Code bits(1) 234 of FIG. 2), as well as the 32 data bits(1-2) (e.g., the 64 data bits associated with a signal copy of the data being written to the memory device), the Golay code bits(2) 328, and the other seven Hamming code bits (such as Hamming Code bits(2) 236 of FIG. 2) may be stored in the same memory array 262.

Figure 4:
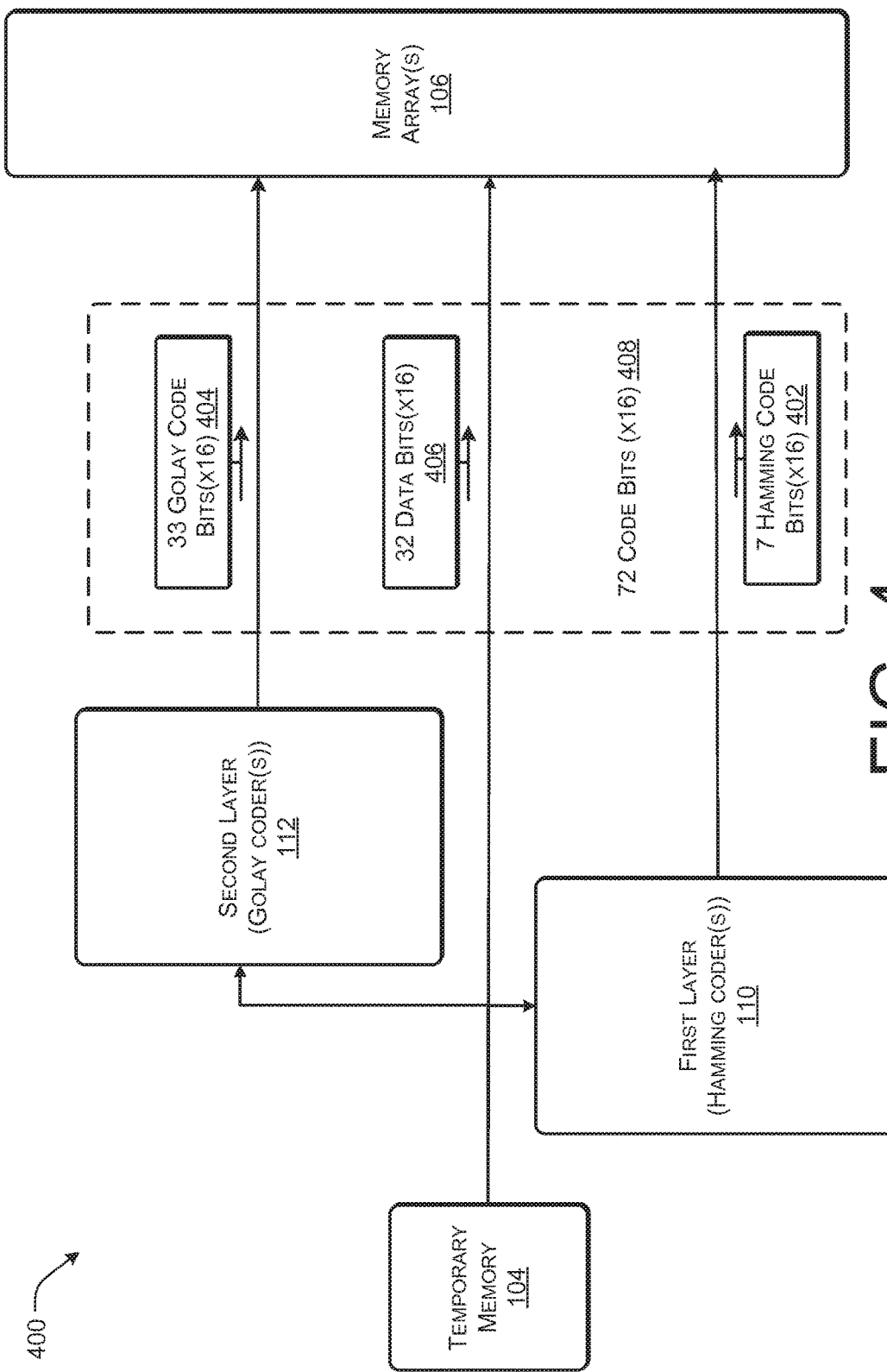
FIG. 4 illustrates another block diagram showing select components of the example two layer quad bit error correction circuit of FIG. 1 according to some implementations.

FIG. 4 illustrates another block diagram showing select components of the example two layer quad bit error correction circuit 108 of FIG. 1 according to some implementations. For instance, in the illustrated example, the first layer 110 of the quad bit error correction circuit 108 of FIG. 1 generates sixteen sets of seven Hamming code bits 402 (such as seven Hamming code bits 236-260 of FIG. 2) as describe above with respect to FIG. 2. Similarly, the second layer 112 of the quad bit error correction circuit 102 of FIG.

1 generates sixteen groups of 33 Golay code bits 404 (such as 33 Golay code bits 324-330 of FIG. 3) via sets of three Golay coders, as describe above with respect to FIG. 3. The seven Hamming code bits 402 and the 33 Golay code bits 404 as associated with 32 data bits 406 (e.g., half of one of the eight copies of 64 data bits being read from temporary memory 104 and written to the memory arrays 106). Together, each set of the seven Hamming code bits 402 and the 33 Golay code bits 404, and the 32 data bits 406 may be stored as a group of 72 code bits 408 in a single memory array of memory. In this manner, each of the 72 code bits 408 may be stored on a different memory array of a memory device to further improve the reliability of the overall memory device.

Figure 5:
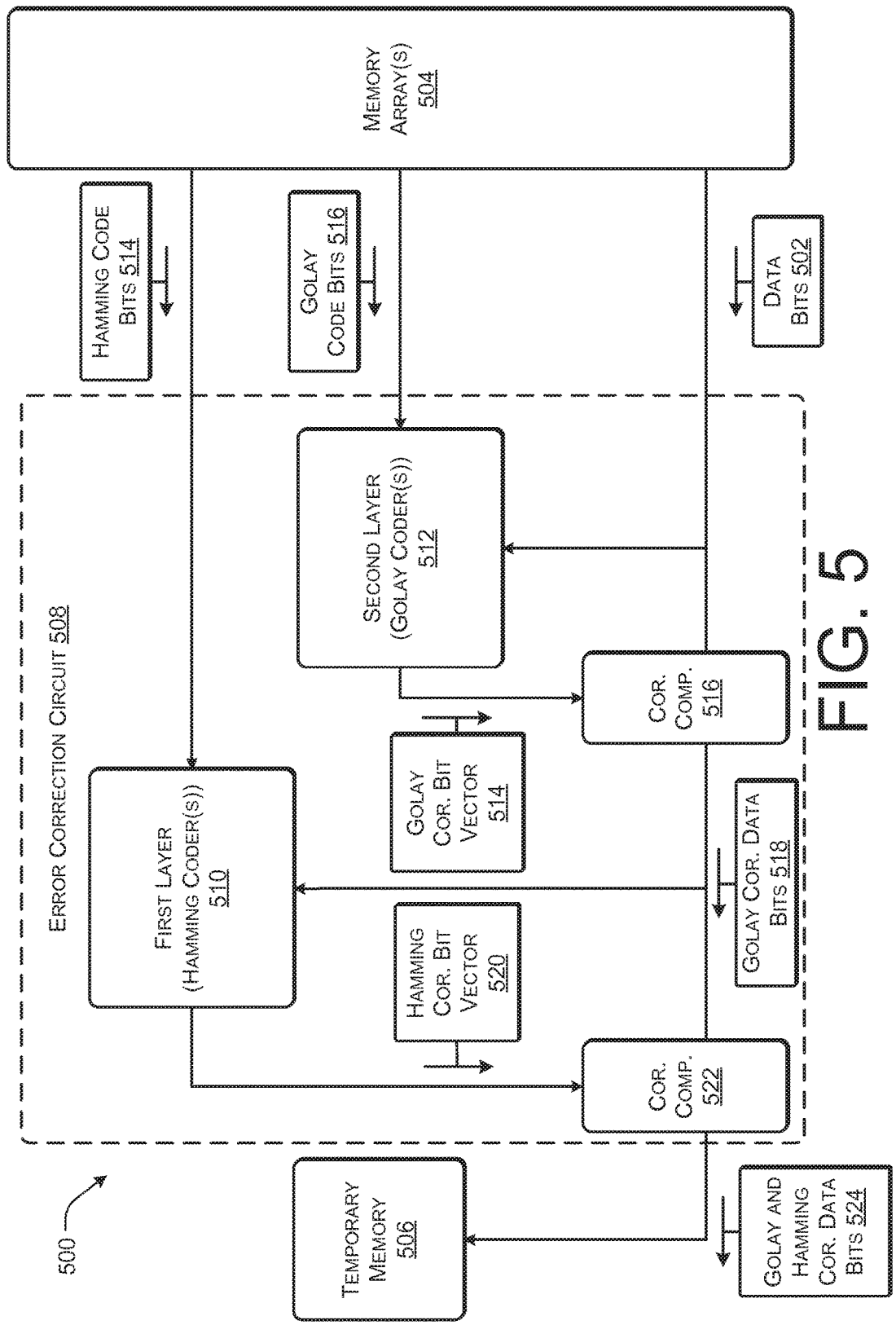
FIG. 5 illustrates a block diagram showing select components of an example two layer quad bit error correction circuit according to some implementations.

FIG. 5 illustrates a block diagram showing select components of an example two layer quad bit error correction circuit according to some implementations. In the current example, a memory device 500 is illustrated as reading data bits 502 stored in a memory array 504 into one or temporary memory 506. In this example, the data bits 502 are decoded by error correction circuit 508 prior to providing the data bits 502 to the temporary memory 506 for access via an external device or component (not shown). As described above, the memory device 500 and/or the memory arrays 504 may be a tangible non-transitory computer storage media and may include volatile and nonvolatile memory and/or removable and non-removable media for storage of information such as computer-readable instructions or modules, data structures, program modules or other data. Such computer-readable media may include, but is not limited to, RAM, ROM, EEPROM, flash memory or other computer-readable media technology, solid state storage, magnetic disk storage, RAID storage systems, storage arrays, network attached storage, storage area networks, cloud storage, or any other medium that can be used to store information and which can be accessed by an external source or internal circuit, such as a processor.

In the current example, the error correction circuit 508 is partitioned into two layers 510 and 512. The first layer 510 includes one or more Hamming coders (or Hamming decoders) and the second layer 512 includes one or more Golay coders (or Golay decoders). In this manner, the memory device may achieve quad bit error correction, as errors that would typically be missed using a Golay error correction code circuit when the data bits 502 are read from the memory arrays 506 may be corrected by the Hamming error correction code circuit and vice versa.

In one example, the memory device 500 may be configured to generate error correction codes prior to storing the data bits 502 in the memory arrays 506. In the current example, the data bits 502 are first processed by one or more Golay coder of the second layer 512 (e.g., the opposite order of the encoding process described above with respect to FIG. 1) to generate a Golay correction bit vector 514 that indicates errors detected by the Golay coders in the second layer 512. The Golay correction bit vector 514 (which indicates the particular bits at which the errors were detected by the Golay coders) is received by a first correction component 516. The first correction component 516 flips (e.g., 0 to 1 or 1 to 0) a value associated with particular data bits 502 at which an error is indicated by the Golay correction bit vector 514 to generate Golay corrected data bits 518.

The Golay corrected data bits 518 are then processed by one or more Hamming coders of the first layer to generate a hamming correction bit vector 520 that indicates errors detected by the Hamming coders in the first layer 510. The Hamming correction bit vector 520 is received by a second correction component 522. The second correction component 522 flips (e.g., 0 to 1 or 1 to 0) a value associated with particular data bits of the Golay corrected data bits 518 at which an error is indicated by the Hamming correction bit vector 520 to generate Golay and Hamming corrected data bits 524. The Golay and Hamming corrected data bits 524 may then be stored in the temporary memory 506 for access by the external device or component.

Figure 6:
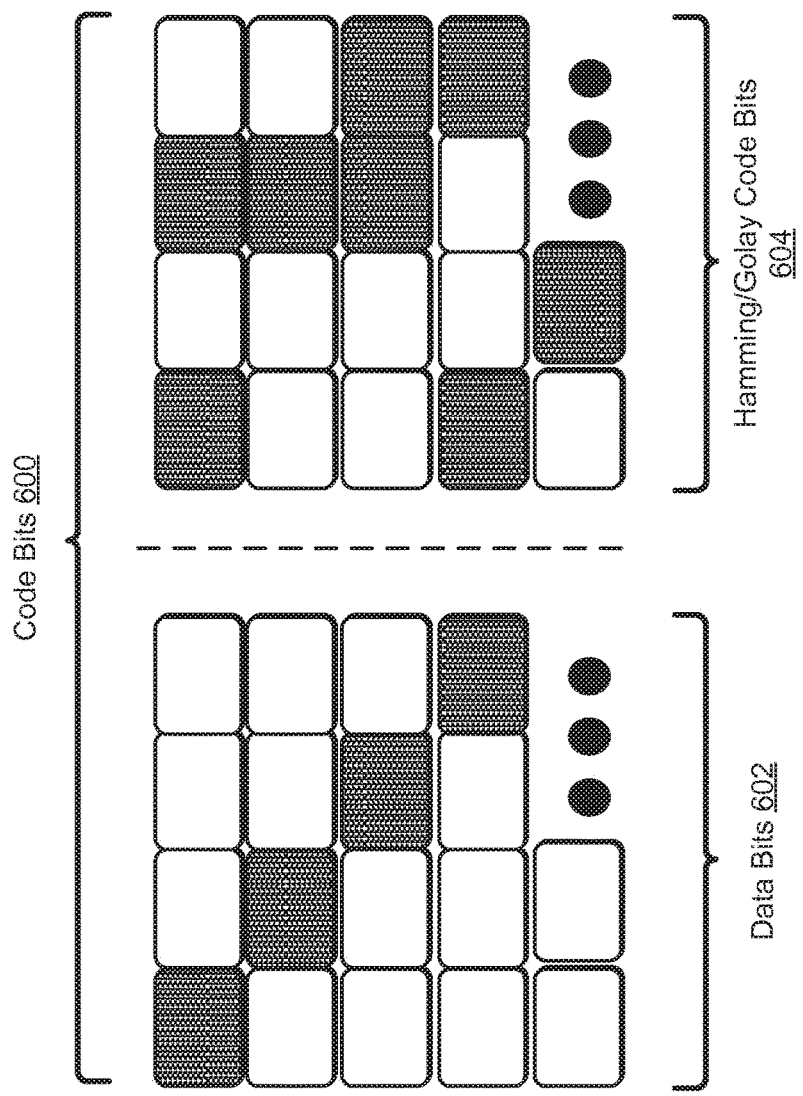
FIG. 6 illustrates example code bits associated with a layer of a two layer quad bit error correction circuit component according to some implementations.

FIG. 6 illustrates example code bits 600 associated with a layer of a two layer quad bit error correction circuit component according to some implementations. For instance, in the illustrated example, the code bits 600 are broken into two parts, the data bits 602 and the Hamming/Golay code bits 604 (e.g., the extra code bits or the code bits generated by the encoder circuits). In general, the data bits 602 are stored along the diagonal (e.g., such as in the form of an identity matrix), while the extra code bits 604 are stored in a pattern that may be analyzed by a corresponding decoder (e.g., a Hamming or a Golay decoder), to reproduce the data bits 602 and/or to generate a correction bit vector which may be utilized to identify errors within the data bits 602 read from a memory device.

Figure 7:
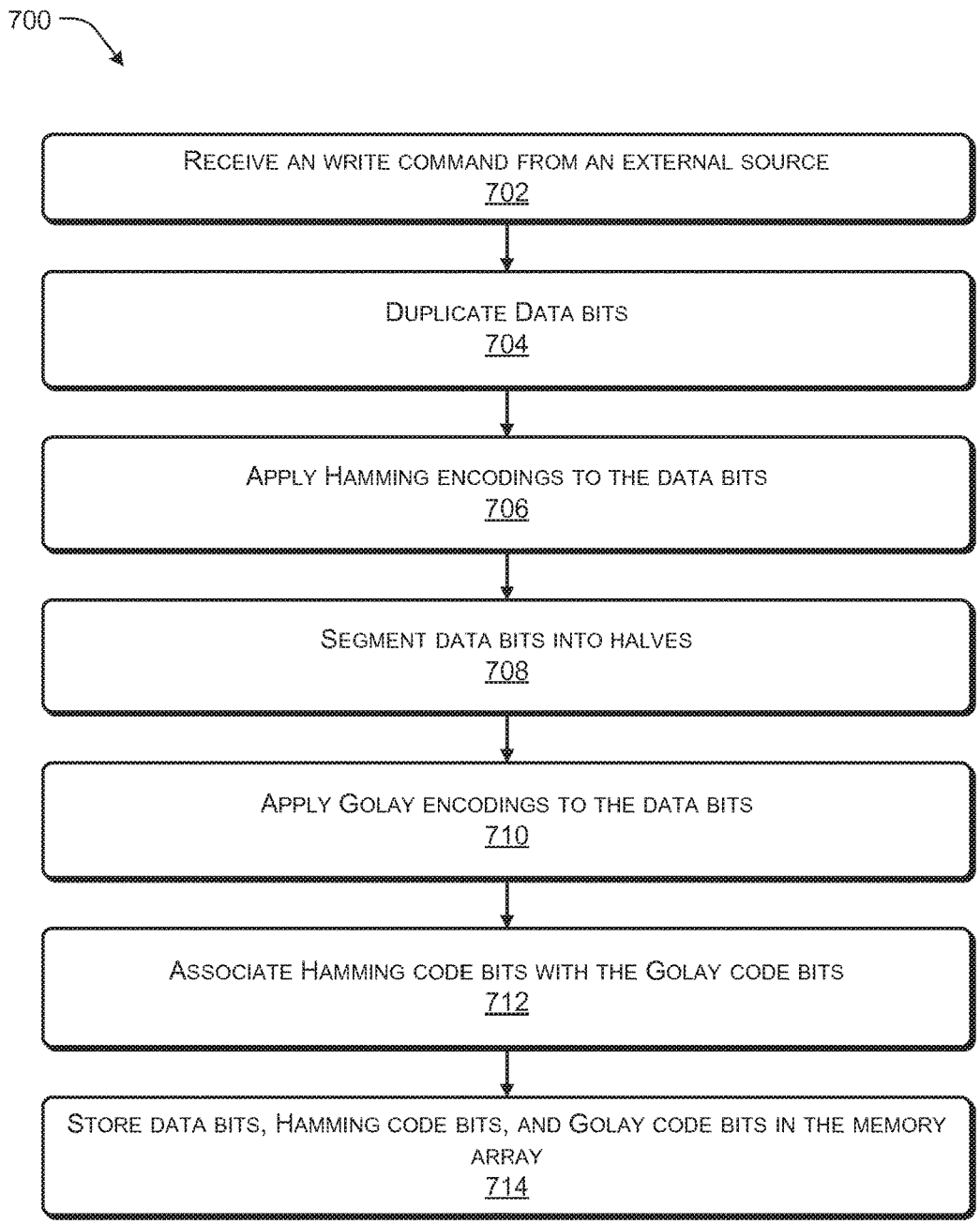
FIG. 7 illustrates an example flow diagram showing an illustrative process for encoding bits according to a two layer quad bit error correction scheme.
Figure 8:
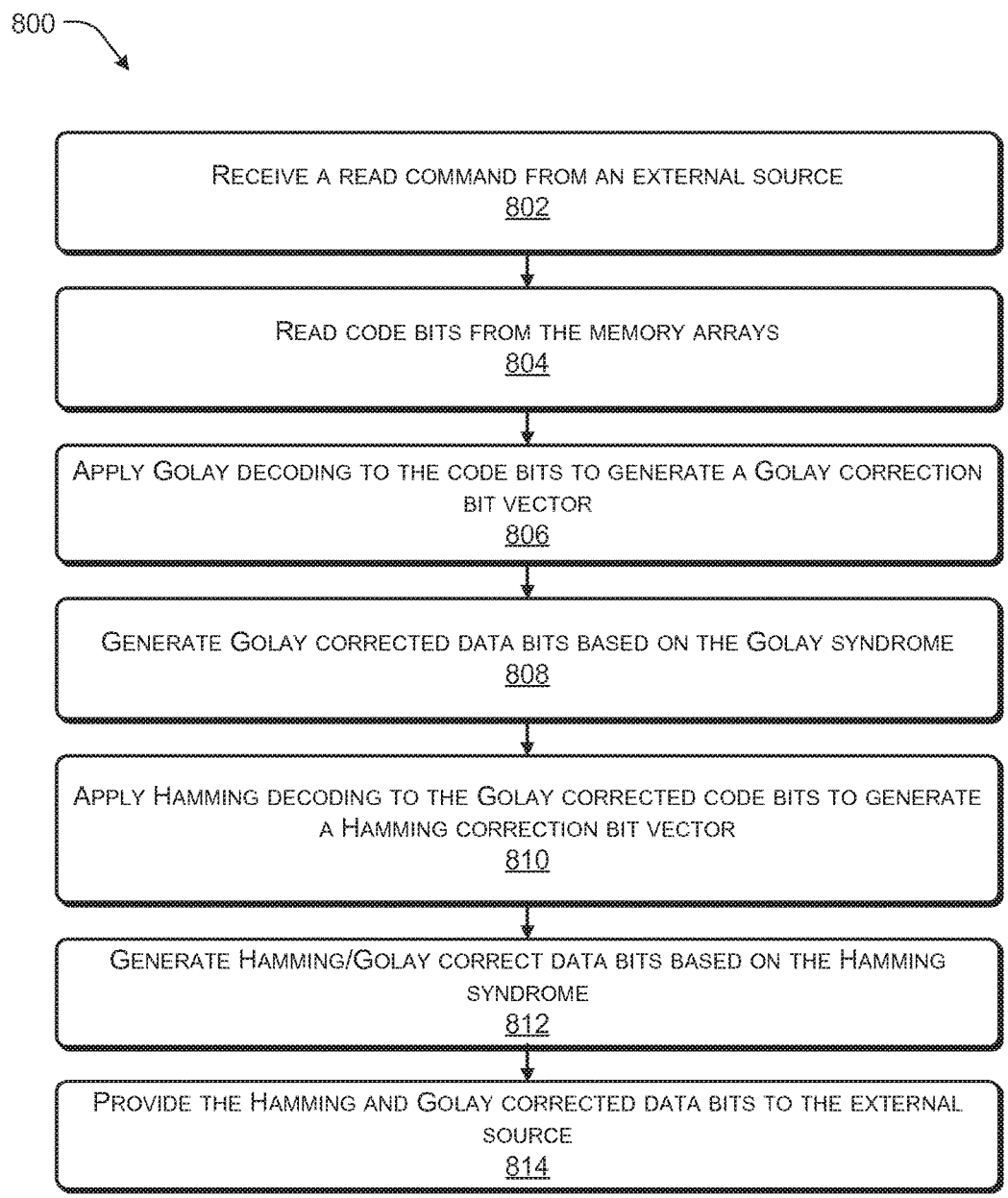
FIG. 8 illustrates an example flow diagram showing an illustrative process for decoding bits according to a two layer quad bit error correction scheme.

FIGS. 7 and 8 are flow diagrams illustrating example processes of associated with accessing data stored in a memory device according to some implementations. The processes are illustrated as a collection of blocks in a logical flow diagram, which represent a sequence of operations, some or all of which can be implemented in hardware, software or a combination thereof. In the context of software, the blocks represent computer-executable instructions stored on one or more computer-readable media that, when executed by one or more processors or control circuits, perform the recited operations.

The order in which the operations are described should not be construed as a limitation. Any number of the described blocks can be combined in any order and/or in parallel to implement the process, or alternative processes, and not all of the blocks need be executed. For discussion purposes, the processes herein are described with reference to the frameworks, architectures and environments described in the examples herein, although the processes may be implemented in a wide variety of other frameworks, architectures or environments.

FIG. 7 illustrates an example flow diagram showing an illustrative process 700 for encoding bits according to a two layer quad bit error correction scheme. For example, each batch of memory devices manufactured, some portion of the memory devices may include some number of bits that fail to operate correctly and, thereby, introduce errors into data stored on the memory devices. Fortunately, the number of bits that fail are typically sparsely located throughout the memory device and include only a small percentage of the overall storage space. Thus, most memory devices are equipped with single bit error correction or double bit error correction which is capable of maintaining data integrity on the memory devices despite the fails bits. However, on some portion of memory devices, single or even double bit error correction may be insufficient to maintain data integrity. Typically, these devices are classified as junk and discarded resulting in a complete loss for the manufacturer of the cost associated with assembling the discarded memory devices. Thus, in the illustrated example, the process 600 shows steps which may be implemented by a memory device to encode data in a manner to allow quad bit error correction, thereby preventing the memory devices from being classified as junk.

For instance, in the illustrated process 700, a memory device may be configured to encode data bits with extra code bits prior to storing the data in the memory arrays, which may be utilized when the data bits are accessed to identify errors within the stored bits. In the illustrated example/the data is first processed by Hamming coders to generate Hamming code bits. The data may then be processed by one or more Golay coders to generate Golay code bits. The data bits may then be stored with the Hamming code bits and the Golay code bits.

At 702, the memory device may receive a write command from an external source. For example, as described above, the memory device may receive a command to store 64 data bits currently held in a temporary memory device.

At 704, the memory device may duplicate the data bits. For instance, the memory device may be configured to generate eight copies of the data bits being stored in the memory device, as described above with respect to FIGS. 1-4. Each copy of the data bits may, thus, be processed independently to further ensure that errors generated when the data bits are stored may be detected and corrected prior to writing the data back into the temporary memory (such as for further processing by a computing device).

At 706, the memory device may apply Hamming encoding to the data bits. For example, the memory device may be equipped with eight Hamming (78, 64) coders, as describe above with respect to FIG. 2. Each of the eight Hamming coders may receive a copy of the 64 bits of data to be stored in the memory device. Thus, each of the Hamming coders may generate individual 14 bit Hamming codes independently from the other seven Hamming coders. Thus, after processing by the Hamming coders, eight different 78 bit Hamming codes (e.g., the 64 data bits plus the 14 Hamming code bits) may be generated.

At 708, the memory device may segment the data bits into halves. For example, as described above, the memory device may divide each of the 64 data bit segments being stored in the memory array into two 32 data bit groups. Thus, the memory device may generate eight copies of the first 32 data bits and eight copies of the last 32 data bits associated with the 64 data bit group being stored in the memory array.

At 710, the memory device may apply Golay encoding to the data bits. For example, the memory device may be equipped with sixteen sets of Golay coders, as describe above with respect to FIG. 3. For instance, each set of Golay coders may include a first Golay (22, 11) coder, a second Golay (22, 11) coder, and a Golay (21, 10) coder. Each of the sixteen sets of Golay coders may receive half of a copy of the 64 bits of data to be stored in the memory device (e.g., each set of the sixteen sets of Golay coders may receive 32 data bits). Thus, each set of Golay coders may each generate individual 33 Golay code bits independently from the other fifteen sets of Golay coders. Thus, after processing by the Golay coders, sixteen different 65 bit Golay codes (e.g., the 32 data bits plus the 33 Golay code bits) may be generated.

At 712, the memory device associates the Hamming extra code bits with the Golay extra code bits. For example, the memory device may select seven of the Hamming code bits generated by each of the eight Hamming coders and associate the seven selected bits with one of the sixteen sets of Golay code bits. In this manner, each of the eight Hamming coders may provide seven Hamming code bits to two of the sixteen sets of Golay code bits. Thus, as shown above with respect to FIG. 4, the memory device may store codes in the memory array including 7 Hamming code bits, 33 Golay code bits, and 32 data bits.

At 714, the memory device stores each of the sixteen groups of Hamming code bits, Golay code bits, and data bits in the memory arrays. In some cases, the memory device may be configured to store two of the sixteen groups in each memory byte. For example, the memory device may have eight arrays and the memory device may be configured to store 144 bits or two 72 bit groups on each byte.

FIG. 8 illustrates an example flow diagram showing an illustrative process 800 for decoding bits according to a two layer quad bit error correction scheme, such as is described above with respect to FIG. 5. At 802, the memory device may receive a read command from an external source. For example, the memory device may receive a command to provide the 64 data bits previously stored in the memory arrays of the memory device into a temporary memory for access by the external source.

At 804, the memory device reads code bits from the memory arrays. In other words, the memory device reads the data bits, the Hamming code bits, and the Golay code bits from the memory array. In some cases, the memory device reads sixteen sets of 72 code bits from various memory arrays. For example, the memory device may read 144 code bits (e.g., two sets of 72 code bits) from each of the memory arrays or from each byte of memory associated with the memory device. Thus, in some cases, the memory device reads 1152 bits from the memory device for each 64 data bits being accessed.

At 806, the memory device applies Golay decoding to the code bits to generate a Golay correction bit vector. For example, since the Golay coding is the second layer of the two layer error correction scheme described herein, the memory device applies the Golay decoding to the code bits prior to applying the Hamming decoding. In other words, the memory device performing the decoding in the opposite order of the encoding. In some cases, the memory device provides each of the sixteen copies of the 72 code bits to a set of Golay decoders. For instance, each set of Golay decoders may include the first Golay (22, 11) coder, the second Golay (22, 11) coder, and the Golay (21, 10) coder. In this instance, the first Golay (22, 11) coder process decode 11 data bits, the second Golay (22, 11) coder may process 11 data bits, and the Golay (21, 10) coder may process 10 data bits to generate a second set of Golay code bits associated with the data bits. The first set of Golay code bits may then be compared to the second set of Golay code bits to generate the Golay correction bit vector.

At 808, the memory device generates Golay corrected data bits based on the Golay correction bit vector. For example, when the memory device compares the first set of Golay code bits to the second set of Golay code bits, the memory device may identify errors in response to any mismatches. In addition to identifying issues, the Golay correction bit vector provides the memory device with an identification of the particular bit at which the error occurred which may then be flipped or corrected.

At 810, the memory device applies Hamming decoding to the Golay corrected code bits to generate a Hamming correction bit vector. For example, since the Hamming coding is the first layer of the two layer error correction scheme described herein, the memory device applies the Hamming decoding to the code bits after applying the Golay decoding. In other words, the memory device performing the decoding in the opposite order of the encoding. In some cases, the memory device provides the seven Hamming code bits and the Golay corrected data bits to the Hamming decoders. The Hamming coders may then generate a second set of Hamming code bits from the Golay corrected data bits, which may then be compared to the first set of Hamming code bits read from the memory array to generate the Hamming correction bit vector.

At 812, the memory device generates Hamming corrected data bits based on the Hamming correction bit vector. For example, when the memory device compares the first set of Hamming code bits to the second set of Hamming code bits, the memory device may identify errors in response to any mismatches. In addition to identifying issues, the Hamming correction bit vector provides the memory device with an identification of the particular bit at which the error occurred which may then be flipped or corrected. Thus, in some examples, the Golay coders may correct up to three errors and the Hamming coders may correct an additional error resulting in a quad bit error correcting system.

At 814, the memory device provides the Hamming/Golay corrected data bits to the external source. For example, the memory device may store the Hamming/Golay corrected data bits in a temporary memory location accessible to the external source.

Figure 9:
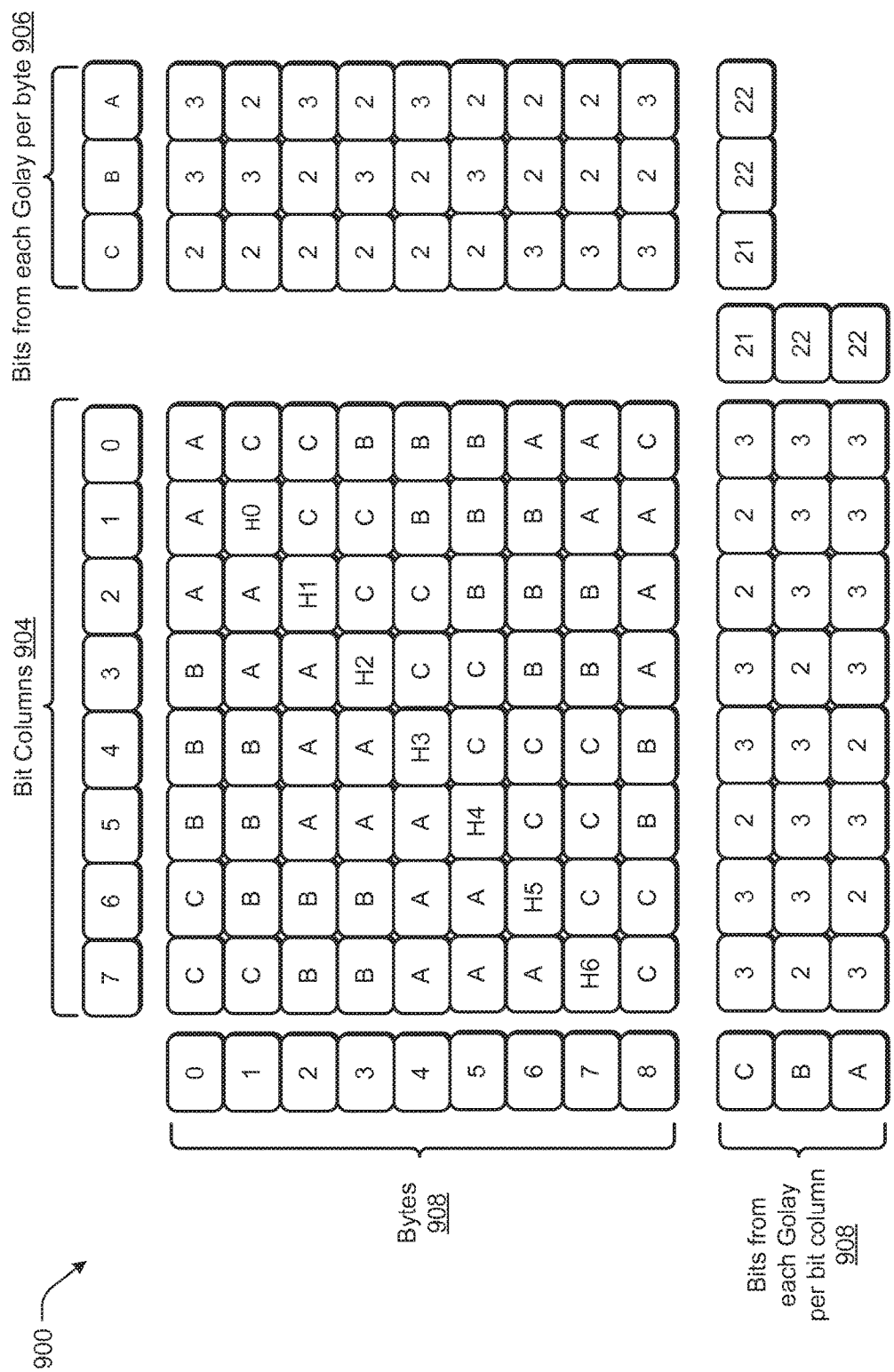
FIG. 9 illustrates a diagram showing an example assignment of bits to encoder according to according to some implementations.

FIG. 9 illustrates a diagram showing an example assignment 906 of bits to encoder according to according to some implementations. For instance, the illustrated example includes 72 bits associated with a single set of Golay coders (e.g., the 33 Golay code bits, the seven Hamming code bits, and the 32 data bits) stored in byes [0-8], generally indicated by 802, and in bit columns [0-7], generally indicated by 804. As illustrated, each bit is processed by one of the three Golay coders [A, B, or C] associated with a set of Golay coders (e.g., the first Golay (22, 11) coder, the second Golay (22, 11) coder, or the Golay (21, 10) coder) or by one of the Hamming coders [H0-H6]. In this manner, for each 72 bit fetch from the memory device, each byte stores no more than three bits processed by any one of the Golay coders and each bit column stores no more than three bits processed by any one of the Golay coders. Additionally, for each 72 bit fetch, each bit column and/or byte of the memory device stores no more than one bit processed by each of the Hamming coders.

For instance, in the illustrated example, byte [0] is illustrated as storing two bits associated with Golay coder [C], three bits associated with Golay coder [B], and three bits associated with Golay coder [A]. Byte [1] is illustrated as storing two bits associated with Golay coder [C], three bits associated with Golay coder [B], two bits associated with Golay coder [A], and one bit associated with Hamming coder [H0]. Byte [2] is illustrated as storing two bits associated with Golay coder [C], two bits associated with Golay coder [B], three bits associated with Golay coder [A], and one bit associated with Hamming coder [H1]. Byte [3] is illustrated as storing two bits associated with Golay coder [C], three bits associated with Golay coder [B], two bits associated with Golay coder [A], and one bit associated with Hamming coder [H2]. Byte [4] is illustrated as storing two bits associated with Golay coder [G], two bits associated with Golay coder [B], three bits from Golay associated with [A], and one bit associated with Hamming coder [H3]. Byte [5] is illustrated as storing two bits associated with Golay coder [C], three bits associated with Golay coder [B], two bits from Golay associated with [A], and one bit associated with Hamming coder [H4]. Byte [6] is illustrated as storing two bits associated with Golay coder [C], three bits associated with Golay coder [B], two bits from Golay associated with [A], and one bit associated with Hamming coder [H5]. Byte [7] is illustrated as storing three bits associated with Golay coder [C], two bits associated with Golay coder [B], two bits from Golay associated with [A], and one bit associated with Hamming coder [H6]. Byte [7] is illustrated as storing three bits associated with Golay coder [C], two bits associated with Golay coder [B], and three bits associated with Golay coder [A].

Additionally, bit column [0] is illustrated as storing three bits associated with Golay coder [C], three bits associated with Golay coder [B], and three bits associated with Golay coder [A]. Bit column [1] is illustrated as storing two bits associated with Golay coder [G], three bits associated with Golay coder [B], three bits associated with Golay coder [A], and one bit associated with Hamming coder [H0]. Bit column [2] is illustrated as storing two bits associated with Golay coder [C], three bits associated with Golay coder [B], three bits associated with Golay coder [A], and one bit associated with Hamming coder [H1]. Bit column [3] is illustrated as storing two bits associated with Golay coder [C], three bits associated with Golay coder [B], three bits associated with Golay coder [A], and one bit associated with Hamming coder [H2]. Bit column [4] is illustrated as storing three bits associated with Golay coder [C], three bits associated with Golay coder [B], two bits from Golay associated with [A], and one bit associated with Hamming coder [H3]. Bit column [5] is illustrated as storing two bits associated with Golay coder [C], three bits associated with Golay coder [B], three bits from Golay associated with [A], and one bit associated with Hamming coder [H4]. Bit column [6] is illustrated as storing three bits associated with Golay coder [C], three bits associated with Golay coder [B], two bits from Golay associated with [A], and one bit associated with Hamming coder [H5]. Bit column [7] is illustrated as storing three bits associated with Golay coder [C], two bits associated with Golay coder [B], three bits from Golay associated with [A], and one bit associated with Hamming coder [H6].

Thus, the total bits from each Golay coder per byte, generally indicated by 906, is either two or three. Additionally, the total bits processed by the Golay coder [C] per byte is 21 (e.g., the bits processed by a Golay (21, 10)). The total bits processed by the Golay coder [B] per byte is 22 (e.g., the bits processed by one of the two Golay (22, 11)). The total bits processed by the Golay coder [A] per byte is 22 (e.g., the bits processed by other one of the two Golay (22, 11)).

Similarly, the total bits from each Golay per bit column, generally indicate by 908, is either two or three. Additionally, the total bits processed by the Golay coder [C] per bit column is 21 (e.g., the bits processed by a Golay (21, 10)). The total bits processed by the Golay coder [B] per bit column is 22 (e.g., the bits processed by one of the two Golay (22, 11)). The total bits processed by the Golay coder [A] per bit column is 22 (e.g., the bits processed by other one of the two Golay (22, 11)).

It should be understood that the association of bits to bytes, bit columns, Hamming coders, and Golay coders illustrated in FIG. 9 is one possible combination or assignment of bits to Hamming and Golay coders and that many other possible combination exist and may be utilized with respect to the implementations described herein.

Figure 10:
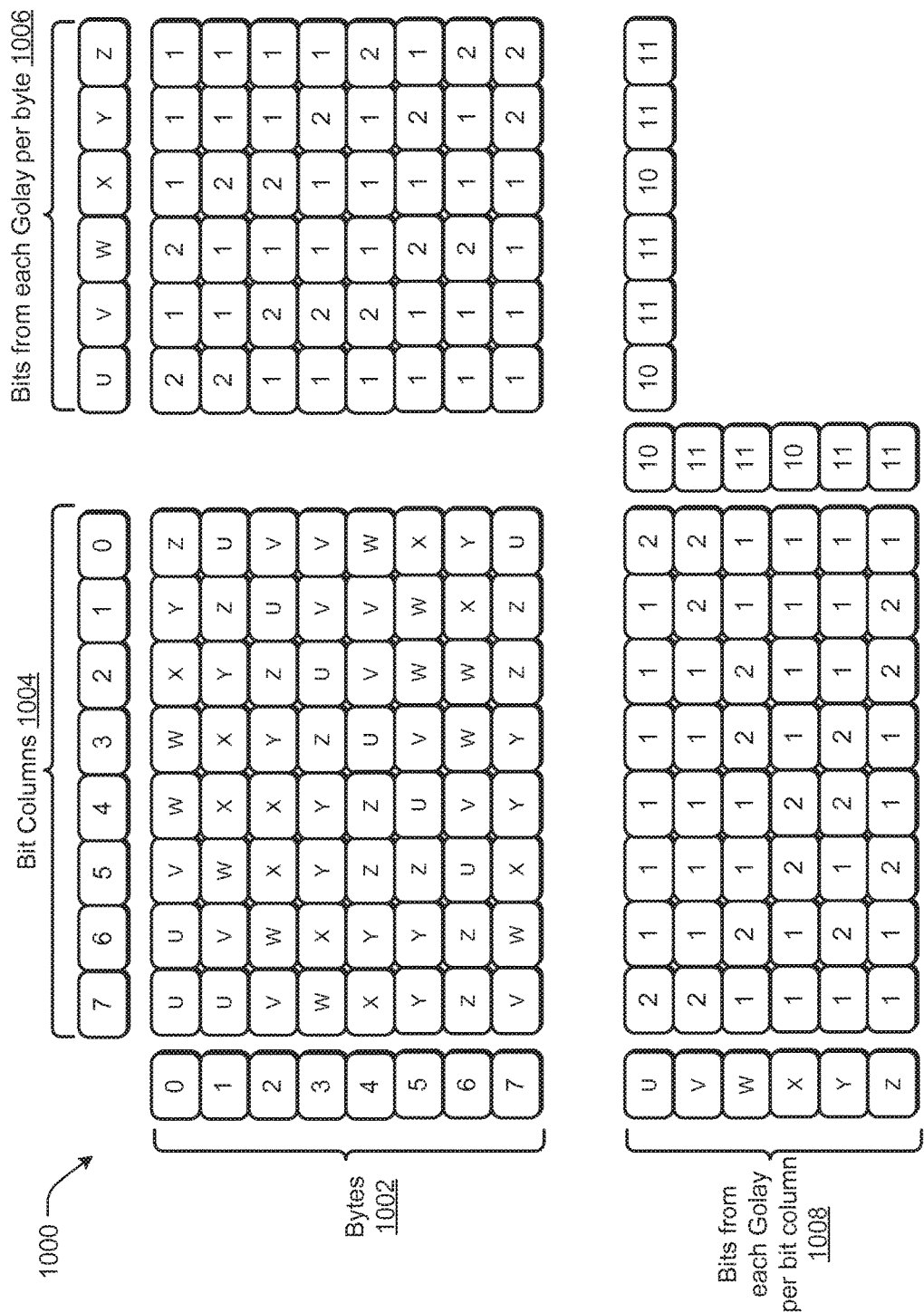
FIG. 10 illustrates a diagram showing an example assignment of bits in the second layer assigned to particular coders of the first layer according to according to some implementations.

FIG. 10 illustrates a diagram showing an example assignment of bits in the second layer assigned to particular coders of the first layer of the quad layer error correction scheme according to according to some implementations. For instance, the illustrated example, shows 64 data bits processed by a single Hamming coder and associated with a 144 bit fetch. The 64 data bits includes bits processed by two sets of Golay coders (e.g., two sets of 32 data bits) stored in byes [0-7], generally indicated by 1002, and in bit columns [0-7], generally indicated by 1004. Thus, the 64 data bits are associated with one of the Hamming coders and two sets of the Golay coders.

As illustrated, each bit is processed by a Hamming coder and one of the six Golay coders [U, V, W, X, Y, or Z]. In this manner, for each 144 bit fetch from the memory device, each byte stores no more than two bits processed by the Hamming coder and any one of the Golay coders and each bit column stores no more than two bits processed by the Hamming coder and any one of the Golay coders. In this example, byte [0] is illustrated as storing two bits associated with Golay coder [U], one bit associated with Golay coder [V], two bits associated with Golay coder [W], one bit associated with Golay coder [X], one bit associated with Golay coder [Y], and one bits associated with Golay coder [Z]. Byte [1] is illustrated as storing two bits associated with Golay coder [U], one bit associated with Golay coder [V], one bits associated with Golay coder [W], two bit associated with Golay coder [X], one bit associated with Golay coder [Y], and one bits associated with Golay coder [Z]. Byte [2] is illustrated as storing one bits associated with Golay coder [U], two bit associated with Golay coder [V], one bits associated with Golay coder [W], two bit associated with Golay coder [X], one bit associated with Golay coder [Y], and one bits associated with Golay coder [Z]. Byte [3] is illustrated as storing one bits associated with Golay coder [U], two bit associated with Golay coder [V], one bits associated with Golay coder [W], one bit associated with Golay coder [X], two bit associated with Golay coder [Y], and one bits associated with Golay coder [Z]. Byte [4] is illustrated as storing one bits associated with Golay coder [U], two bit associated with Golay coder [V], one bits associated with Golay coder [W], one bit associated with Golay coder [X], one bit associated with Golay coder [Y], and two bits associated with Golay coder [Z]. Byte [5] is illustrated as storing one bits associated with Golay coder [U], one bit associated with Golay coder [V], two bits associated with Golay coder [W], one bit associated with Golay coder [X], two bit associated with Golay coder [Y], and one bits associated with Golay coder [Z]. Byte [6] is illustrated as storing one bits associated with Golay coder [U], one bit associated with Golay coder [V], two bits associated with Golay coder [W], one bit associated with Golay coder [X], one bit associated with Golay coder [Y], and two bits associated with Golay coder [Z], byte [7] is illustrated as storing one bits associated with Golay coder [U], one bit associated with Golay coder [V], one bits associated with Golay coder [W], one bit associated with Golay coder [X], two bit associated with Golay coder [Y], and two bits associated with Golay coder [Z].

Additionally, bit column [0] is illustrated as storing two bits associated with Golay coder [U], two bit associated with Golay coder [V], one bits associated with Golay coder [W], one bit associated with Golay coder [X], one bit associated with Golay coder [Y], and one bits associated with Golay coder [Z]. Bit column [1] is illustrated as storing one bits associated with Golay coder [U], two bit associated with Golay coder [V], one bits associated with Golay coder [W], one bit associated with Golay coder [X], one bit associated with Golay coder [Y],and two bits associated with Golay coder [Z]. Bit column [2] is illustrated as storing one bits associated with Golay coder [U], one bit associated with Golay coder [V], two bits associated with Golay coder [W], one bit associated with Golay coder [X], one bit associated with Golay coder [Y] and two bits associated with Golay coder [Z]. Bit column [3] is illustrated as storing one bits associated with Golay coder [U], one bit associated with Golay coder [V], two bits associated with Golay coder [W], one bit associated with Golay coder [X], two bit associated with Golay coder [Y], and one bits associated-with Golay coder [Z]. Bit column [4] is illustrated as storing one bits associated with Golay coder [U], one bit associated with Golay coder [V], one bits associated with Golay coder [W], two bit associated with Golay coder [X], two bit associated with Golay coder [Y], and one bits associated with Golay coder [Z]. Bit column [5] is illustrated as storing one bits associated with Golay coder [U], one bit associated with Golay coder [V], one bits associated with Golay coder [W], two bit associated with Golay coder [X], one bit associated with Golay coder [Y], and two bits associated with Golay coder [Z]. Bit column [6] is illustrated as storing one bits associated with Golay coder [U], two bit associated with Golay coder [V], two bits associated with Golay coder [W], one bit associated with Golay coder [X], two bit associated with Golay coder [Y], and one bits associated with Golay coder [Z]. Bit column [7] is illustrated as storing two bits associated with Golay coder [U], two bit associated with Golay coder [V], one bits associated with Golay coder [W], one bit associated with Golay coder [X], one bit associated with Golay coder [Y], and one bits associated with Golay coder [Z].

Thus, in the illustrated example, the total data bits from each Golay coder per byte, generally indicated by 1006, is either one or two. Additionally, the total data bits processed by the Golay coder [U] per byte is 10 (e.g., the bits processed by a Golay (21, 10)). The total data bits processed by the Golay coder [V] per byte is 11 (e.g., the bits processed by one of the two Golay (22, 11)). The total data bits processed by the Golay coder [W] per byte is 11 (e.g., the bits processed by other one of the two Golay (22, 11)). The total data bits processed by the Golay coder [X] per byte is 10 (e.g., the bits processed by a Golay (21, 10)). The total data bits processed by the Golay coder [Y] per byte is 11 (e.g., the bits processed by one of the two Golay (22, 11)). The total data bits processed by the Golay coder [Z] per byte is 11 (e.g., the bits processed by other one of the two Golay (22, 11)).

Similarly, the total data bits processed by the Golay coder [U] per bit column is 10 (e.g., the bits processed by a Golay (21, 10)). The total data bits processed by the Golay coder [V] per bit column is 11 (e.g., the bits processed by one of the two Golay (22, 11)). The total data bits processed by the Golay coder [W] per bit column is 11 (e.g., the bits processed by other one of the two Golay (22, 11)). The total data bits processed by the Golay coder [X] per bit column is 10 (e.g., the bits processed by a Golay (21, 10)). The total data bits processed by the Golay coder [Y] per bit column is 11 (e.g., the bits processed by one of the two Golay (22, 11)). The total data bits processed by the Golay coder [Z] per bit column is 11 (e.g., the bits processed by other one of the two Golay (22, 11)).

It should be understood that the association of bits to bytes, bit columns, Hamming coders, and Golay coders illustrated in FIG. 10 is one possible combination or assignment of bits to Hamming and Golay coders and that many other possible combination exist and may be utilized with respect to the implementations described herein.

Figure 11:
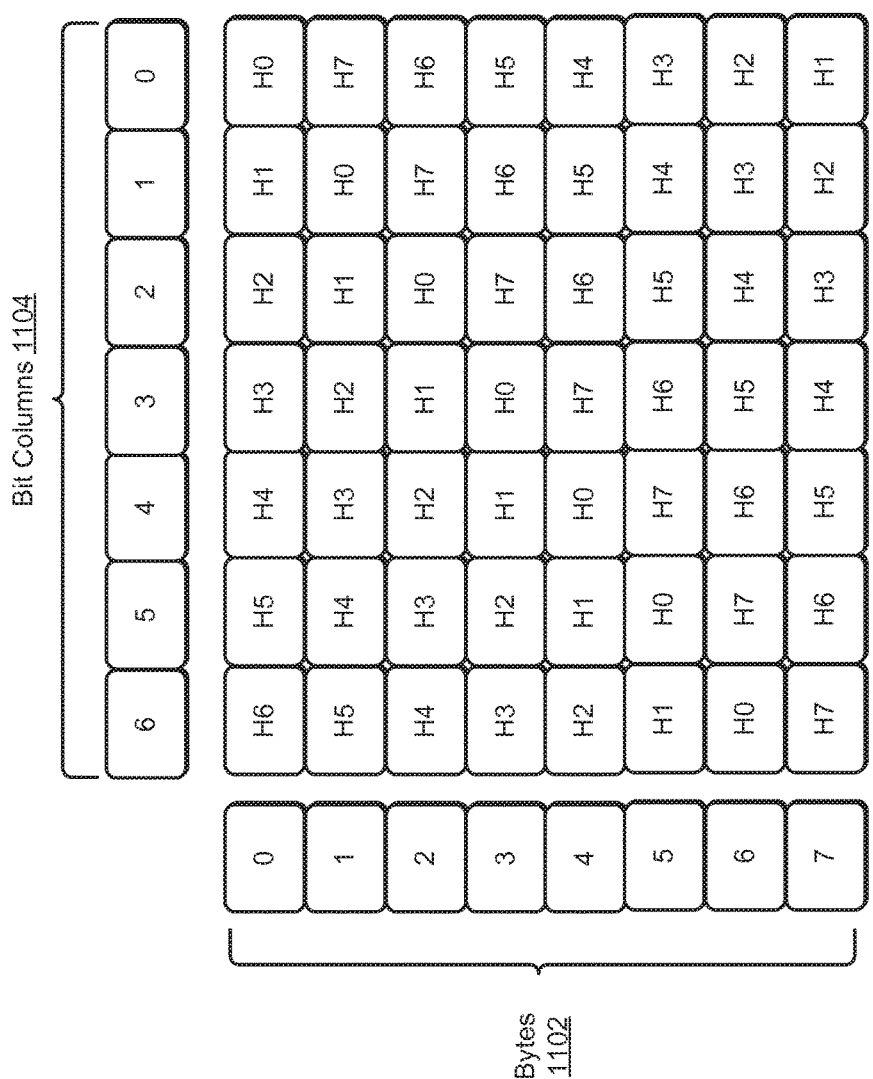
FIG. 11 illustrates a diagram showing an example assignment of bits to the first layer coders according to according to some implementations.

FIG. 11 illustrates a diagram showing an example assignment 1100 of bits to the first layer coders according to according to some implementations. For instance, the illustrated example, shows 56 Hamming code bits (e.g., half of the 112 Hamming code bits generated by-eight Hamming coders). The 56 Hamming code bits are stored in bytes [0-7], generally indicated by 1102, and in bit columns [0-6], generally indicated by 1104. Thus, the 56 data bits are arranged in the memory device such that each half of the Hamming code from each Hamming coder are associated with one bit of a 72 bit fetch.

For instance, in the illustrated example, one of the seven bits from Hamming code [H0] is stored in bytes [0-6] and bit columns [0-6]. One of the seven bits from Hamming code [H2] is stored in bytes [0-4 and 6-7] and bit columns [0-6]. One of the seven bits from Hamming code [H3] is stored in bytes [0-3 and 5-7] and bit columns [0-6]. One of the seven bits from Hamming code [H4] is stored in bytes [0-2 and 4-7] and bit columns [0-6]. One of the seven bits from Hamming code [H5] is stored in bytes [0-2 and 3-7] and bit columns [0-6]. One of the seven bits from Hamming code [H6] is stored in bytes [0 and 2-6] and bit columns [0-6]. One of the seven bits from Hamming code [H7] is stored in bytes [1-7] and bit columns [0-6].

Although the subject matter has been described in language specific to structural features, it is to be understood that the subject matter defined in the appended claims is not necessarily limited to the specific features described. Rather, the specific features are disclosed as illustrative forms of implementing the claims.

What is claimed is:

1. An error correction circuit, comprising:
   a first layer, the first layer comprising one or more Hamming coders, wherein each Hamming coder of the one or more Hamming coders is configured to process data to generate a Hamming code, wherein the Hamming code comprises the data and Hamming code bits; and
   a second layer, the second layer comprising one or more sets of Golay coders, wherein at least one set of Golay coders is configured to process the data to generate a corresponding Golay code, wherein the Golay code comprises the data and Golay code bits,
   wherein one of the first layer or the second layer is configured to correct errors within the data missed by the other of the first layer or the second layer based on the Hamming code and the Golay code, causing the error correction circuit to correct quad bit errors.

2. The error correction circuit of claim 1, wherein each of the one or more Hamming coders is associated with two sets of Golay coders.

3. The error correction circuit of claim 1, wherein the data is segmented into a first size of 64 bits and a second size of 32 bits.

4. The error correction circuit of claim 1, wherein at least one set of Golay coders comprises a first Golay (22, 11) coder, a second Golay (22, 11) coder, and a Golay (21, 10) coder.

5. The error correction circuit of claim 1, wherein at least one of the one or more Hamming coders is a Hamming (78, 64) coder.

6. The error correction circuit of claim 1, wherein the error correction circuit comprises one or more memory arrays, and no more than three Golay code bits generated by a Golay coder of the one or more sets of Golay coders are stored in a byte of the one or more memory arrays.

7. The error correction circuit of claim 1, wherein the error correction circuit comprises one or more memory arrays, and no more than three Golay code bits generated by a Golay coder of the one or more sets of Golay coders are stored in a bit column of the one or more memory arrays.

8. A method comprising:
   receiving, by a memory device, data to be stored in one or more memory arrays of the memory device;
   processing, by each of one or more Hamming coders, the data to generate a Hamming code, wherein the Hamming code comprises the data and Hamming code bits;
   processing, by at least one set of one or more sets of Golay coders, the data to generate a Golay code, wherein the Golay code comprises the data and Golay code bits; and
   correcting, based on the Hamming code and the Golay code, a quad bit error, wherein one of (i) the each of the one or more Hamming coders or (ii) the at least one set of one or more sets of Golay coders is configured to correct errors within the data missed by the other of (i) the each of the one or more Hamming coders and (ii) the at least one set of one or more sets of Golay coders.

9. The method of claim 8, wherein each of the one or more Hamming coders is associated with two sets of Golay coders.

10. The method of claim 8, wherein the data is segmented into a first size of 64 bits and a second size of 32 bits.

11. The method of claim 8, wherein at least one set of Golay coders comprises a first Golay (22, 11) coder, a second Golay (22, 11) coder, and a Golay (21, 10) coder.

12. The method of claim 8, wherein at least one of the one or more Hamming coders is a Hamming (78, 64) coder.

13. The method of claim 8, wherein no more than three Golay code bits generated by a Golay coder of the one or more sets of Golay coders are stored in a byte of the one or more memory arrays.

14. The method of claim 8, wherein no more than three Golay code bits generated by a Golay coder of the one or more sets of Golay coders are stored in a bit column of the one or more memory arrays.

15. An error correction circuit, comprising:
   a first layer comprising one or more Hamming coders, wherein each Hamming coder of the one or more Hamming coders is configured to:
   receive data bits to be stored in one or more memory arrays,
   generate a first set of Hamming code bits based on the received data bits, and
   store the first set of Hamming code bits in the one or more memory arrays; and
   a second layer comprising one or more sets of Golay coders, wherein each set of the one or more sets of Golay coders is configured to:
   receive a portion of the data bits to be stored in the one or more memory arrays,
   generate a first set of Golay code bits based on the received portion of the data bits, and
   store the first set of Golay code bits in the one or more memory arrays,
   wherein one of the first layer or the second layer is configured to correct errors within the data bits missed by the other of the first layer or the second layer based on the first set of Hamming code bits and the first set of Golay code bits, causing the error correction circuit to correct quad bit errors.

16. The error correction circuit of claim 15, wherein each set of the one or more sets of Golay coders comprises a plurality of Golay coders.

17. The error correction circuit of claim 16, wherein the portion of the data bits is allocated among the plurality of Golay coders.

18. The error correction circuit of claim 15, wherein each Hamming coder of the one or more Hamming coders is further configured to:

generate a second set of Hamming code bits based on the received data bits, and generate a Hamming correction bit vector based on the first set of Hamming code bits and the second set of Hamming code bits; and each set of the one or more sets of Golay coders is further configured to:

generate a second set of Golay code bits based on the received portion of the data bits, and generate a Golay correction bit vector based on the first set of Golay code bits and the second set of Golay code bits.

19. The error correction circuit of claim 18, further comprising:

one or more correction components configured to correct quad bit errors based on the Hamming correction bit vector and the Golay correction bit vector.

20. The error correction circuit of claim 15, wherein the data bits are received by the one or more Hamming coders in blocks of 64 bits.

\* \* \* \* \*